March 8, 1960 R. R. POWELL 2,928,009

TRANSISTOR SWITCHING CIRCUIT

Filed April 11, 1956

INVENTOR
Ralph R. Powell
By Earl Beust, Louis A Kline, John J. Matlago
His Attorneys United States Patent Office 2,928,009

Patented Mar. 8, 1960

2,928,009

TRANSISTOR SWITCHING CIRCUIT

Ralph R. Powell, Los Angeles, Calif., assignor to The National Cash Register Company, Dayton, Ohio, a corporation of Maryland Application April 11, 1956, Serial No. 577,550

10 Claims. (Cl. 307—88.5)

This invention relates to electronic switching circuits and more particularly to a transistor circuit arrangement for switching high current square wave pulses to a load.

It has heretofore been the practice to drive the cores of a magnetic core memory matrix, for example, by the use of a high current pulse generator source which selectively supplies pulses to the windings passing through the cores by an appropriate switching arrangement. A much simpler and more desirable method contemplates forming the high current load pulses by using a transistor to switch a source of steady state potential periodically across the windings of the cores, dependent on the application of low current switching pulses to the base of the transistor. Heretofore this method of forming the high current pulses has not been used because of the poor frequency response characteristic of high power transistors which prevents a sharp leading edge from being formed on the high current pulses, as needed for driving core memories, for example. The present invention overcomes this undesirable property of high power transistors by providing a transistor switching arrangement which will carry high current loads and which also has a high frequency response, i.e., has a fast switching time.

The switching circuit of the present invention comprises a low and a high power transistor connected in parallel. When a square wave voltage is applied to their bases, the transistors start to conduct and the current passing through both combines to form the pulse used to drive the load. The low power transistor which characteristically has a high frequency response initially passes a large load current in response to the high frequency waves which make up the leading edge of the base switching pulse. The high frequency response of this transistor causes the leading edge of its load current pulse to have a very sharp rise time. The high power transistor which characteristically has a low frequency response is arranged to pass the bulk of the load current in response to the low frequency waves which make up most of the steady state part of the base pulse. The load current pulses through both transistors thus add to form a large current pulse which has a leading edge with the characteristic short rise time of the low power transistor. In addition, the switching current provides for creating a short fall time on the load pulse. This switching circuit thus overcomes the long response time of conventional high power transistor switching arrangements.

It is accordingly an object of this invention to provide a transistor switching arrangement which will not only carry high power but will also have a fast switching time.

It is another object of this invention to provide a high power transistor switching arrangement which will respond to a small square wave current switching pulse to form a large amplitude square wave output current pulse useful for driving other circuits.

It is another object of this invention to provide a switching circuit arrangement for obtaining current driving pulses from a steady state source which utilizes a low power transistor to gain fast switching times and a greater power transistor to carry the bulk of the current during the remaining portion of the switching time.

It is still another object of this invention to provide a transistor switching circuit to form high current pulses with very short rise and fall times which can be used for driving cores in a magnetic core memory matrix.

These and other objects of this invention as well as a better understanding and comprehension thereof can be obtained from the following description and drawings in which.

Figure 1:
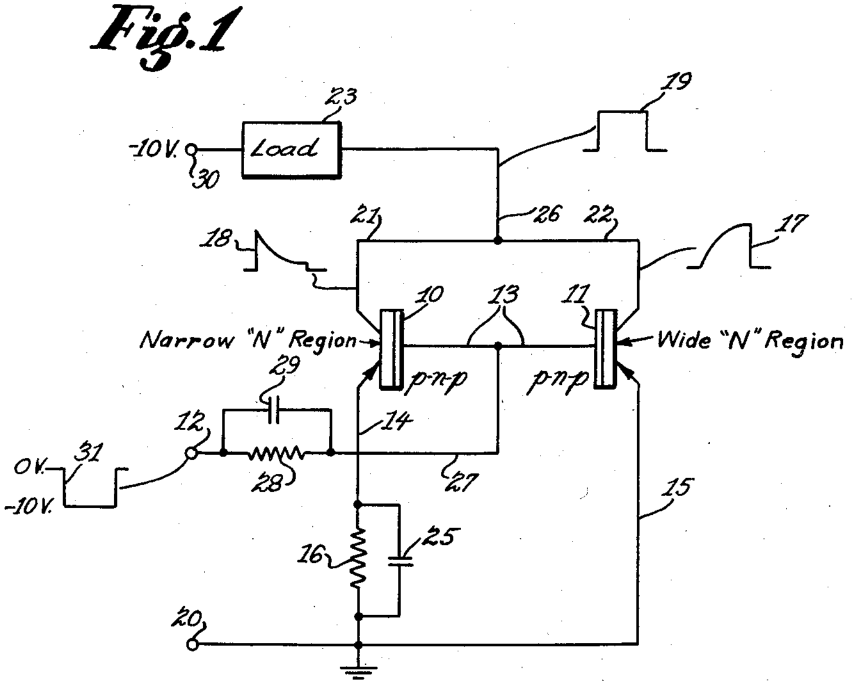
Fig. 1 is a schematic diagram of the preferred embodiment of the switching circuit.

Referring to Fig. 1, the switching circuit of the present invention comprises two p-n-p junction type transistors 10 and 11 with their emitter-to-collector current paths connected in parallel to a single load line 26 and with their base inputs connected in parallel to a common switching pulse source 12. Both transistors are connected in grounded-emitter arrangements. Emitter line 14 of transistor 10 is connected to ground by way of resistor 16 and parallel capacitor 25, while emitter line 15 of transistor 11 is connected directly to ground. Collector line 21 of transistor 10 and collector line 22 of transistor 11 are both connected to load line 26 which in turn is connected to a −10 volt D.C. potential power source 30 by way of load 23. The common base line 13 of the two transistors connects to switching line 27 which is in turn connected to switching source 12 by way of resistor 28 and parallel capacitor 29. The switching pulse source 12 is grounded at terminal 20.

A transistor conventionally can be used as a switch to control the flow of a large emitter-to-collector current pulse by means of a small switching current flowing through its base. This circuit utilizes the two transistors 10 and 11 arranged in parallel as switches to pass pulses of current through their emitter-to-collector current paths. The current of these pulses passes from ground through the parallel transistors 10 and 11 into load line 26, and to the −10 volt source 30 by way of a load 23. The load 23 may be a row of magnetic cores in a core memory array, for example. As is well known in the prior art, whenever it is desired to drive the cores, a switching pulse 31 is applied to the base input of transistors 10 and 11 which connects to common base line 13 by way of switching line 27.

It is characteristic of transistors capable of carrying a large load current to have a somewhat poorer frequency response to switching pulses applied to their base than lower power transistor units. This may be understood by noting that a p-n-p transistor is comprised of two P type regions separated by a thin layer of N type region, as is well known in the art. The frequency response difference in p-n-p transistors of these two types is caused mainly by the diffusion time of the carriers passing across the N type region from one P type region to the other. The width of the N type region is necessarily much greater for a high power transistor than for a low power transistor. Because of its wider N type region, the high power transistor has a long diffusion time which prevents the load current from responding to the high frequencies of the base signal. On the other hand, because of the narrower N type region in a low power transistor, the load current is able to respond to the high frequencies of the base pulse. Therefore, in response to a square base switching pulse, a high power transistor will pass a load current pulse whose leading edge has a long rise time, while a low power transistor will pass a load current pulse whose leading edge has a sharp rise time. The parallel switching circuit of the present invention combines the properties of both of these types of transistors so as to provide a switching arrangement which will safely carry a high current load and at the same time form pulses whose leading edges have very sharp rise times.

A more detailed description will be made of the invention by referring to the timing waveform diagram shown in Fig. 2. It should be noted that load 23 is considered to be primarily resistive when discussing these waveforms, and that the voltage and amperage values, although typical, are shown for purpose of illustration only. The switching transistors 10 and 11, as seen in Fig. 1, will pass a load current by way of their emitter-to-collector current paths only when their bases and collectors are both biased negative relative to their grounded emitters. The switching signal is a square wave pulse 31 which is at ground potential when the transistor switches are open and is at −10 volts when they are closed.

Figure 2:
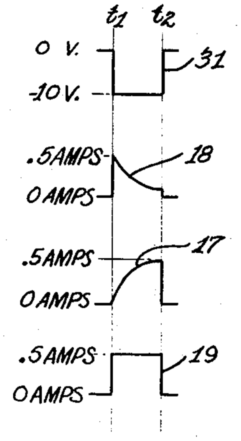
Fig. 2 is a waveform timing diagram for explaining the operation of the switching circuit shown in Fig. 1.

Referring now to Fig. 2, at time $t_1$, the switching pulse 31 drops to a steady state value of −10 volts, thus causing both transistors 10 and 11 to switch to a conducting state during which a current pulse 19 begins to flow through the load 23 to the −10 volt source 30 (Fig. 1). This load pulse 19 is the sum of the current pulses 18 and 17 flowing through transistors 10 and 11, respectively. The initial conduction through transistor 10 is due to capacitor 25 (Fig. 1), which is uncharged prior to time $t_1$, such that it momentarily provides a low impedance path for current through the transistor. Thus the leading edge of the current wave 18 at the collector of low power transistor 10 has a very short rise time, because of its characteristic ability to pass current in response to the high frequency waves making up the leading edge of the base pulse. At the same time, only a small amount of current will pass through high power transistor 11 because of its characteristic inability to pass current in response to the high frequency waves of the base pulse 31.

After time $t_1$, the amplitude of the current wave through transistor 10 drops rapidly, in accordance with the RC constant of capacitor 25 and resistor 16, finally reaching a steady state as determined by the impedance of transistor 10 and resistor 16. As shown by waveform 17, the high power transistor 11, which switches much slower for a given base current, is rapidly allowing more current to pass. The rapid increase of load current through transistor 11 is due to the increased amplitude of the low frequency waves of the base pulse, to which this transistor is capable of responding. As both transistors begin to conduct, the effective impedance of transistor 10 and resistor 16 is greater than the impedance of transistor 11 so that the latter high power unit carries the bulk of the load current. It is thus noted that the combined amplitude of the current waves through both transistors 10 and 11 approaches a steady state value, the bulk of the load current passing through transistor 11 and the remainder passing through transistor 10, as limited by resistor 16.

At time $t_2$, the switching circuit is opened, i.e., the transistors become non-conductive by the base switching pulse rising to 0 volt. Thus, the trailing edges of the load current pulses 17 and 18 through both transistors, and consequently the combined load current pulse 19, falls to 0 amp in a very short fall time. This action may be understood by noting that when a p-n-p transistor is conducting as a closed switch, its N type region, to which its base terminal is connected, will become saturated with minority carriers, as is well known in the art. Upon application of a positive potential to the base of a conducting transistor, these accumulated minority carriers will cause the load current pulse to have a long fall time. Capacitor 29 (Fig. 1), which is very quickly charged when the switching pulse rises to 0 volt at time $t_2$, removes these minority carriers from both transistors 10 and 11, resulting in the short fall time of the load current pulses 17 and 18.

Referring back to Fig. 1, it should be noted that resistor 16 is chosen to make the effective switched impedance of the current path including the lower power transistor 10 greater than the effective switched impedance of the current path including the higher power transistor 11. In addition, capacitor 25 is chosen to carry the load current which initially flows through transistor 10. Since the low power transistor 10 carries a high current for only a short period of time, the average current which it carries during a pulse or series of pulses is well within its power rating.

The switching circuit of the present invention takes advantage of both the desirable high current carrying characteristic of the high power transistor and the desirable high frequency response characteristic of the low power transistor, to form a high current load pulse whose leading and trailing edges change abruptly in accordance with the shape of the square wave switching pulse applied to the switching circuit. This novel circuit has many useful applications and is not intended to be limited to the application of driving cores in a magnetic core memory matrix, as described in the preferred embodiment.

While the form of the invention shown and described herein is admirably adapted to fulfill the objects primarily stated, it is to be understood that it is not intended to confine the invention to the one form or embodiment disclosed herein, for it is susceptible of embodiment in various other forms.

What is claimed is:

1. A switching circuit comprising a high power and a low power transistor, each of which has an emitter, a collector, and a base, said transistors characterized by the n-type semi-conductive material in the intermediate zone being wider in the high power transistor than in the low power transistor; a direct-current power source for a load circuit connected across the collectors and emitters of said transistors; and a switching input connected to both said bases, whereby the combined current conduction of said transistors in response to a square wave pulse on said switching input forms a load current square wave pulse having a short rise time.

2. An electrical circuit comprising a high power and a low power transistor, each of which has an emitter, a collector, and a base; a direct-current power source connected by way of a load circuit between the collectors and emitters of said transistors, the emitter path of said low power transistor including a resistor and a shunt capacitor; and a switching input circuit connected to both said bases, whereby in response to a square wave pulse on said switching input, the low power transistor provides current for the fast rise of a load current pulse and the high power transistor provides the bulk of the load current for the remaining period of the switching pulse, and together provide a square wave load current pulse.

3. A switching circuit comprising a high power and a low power transistor, each of which has an emitter, a collector, and a base; a power source connected by way of a load circuit across the collectors and emitters of said transistors in parallel, the emitter path of said low power transistor including a first resistor and a first shunt capacitor; and an input circuit connected to both said bases, said input circuit including a second resistor and a second shunt capacitor, whereby in response to a square wave pulse on said input circuit, said high power transistor provides the bulk of the current for a load pulse, while said low power transistor together with the first and second capacitors function to form a short rise and fall time on said load pulse, and the two transistor currents combine to form a square wave load pulse.

4. A switching circuit comprising a pair of transistors having different frequency response characteristics, each of said transistors having an emitter electrode, a collector electrode, and a base electrode, said transistors connected in a grounded-emitter arrangement; a direct-current power source connected by way of a load circuit to both the collector electrodes of said transistor; a resistor and a shunt capacitor connected in the emitter path of one of said transistors; a source of square wave switching pulses; and means for applying said switching pulses to the base electrode of both said transistors whereby the resulting simultaneous conduction through both said transistors combines to form a high current square wave load pulse.

5. An electrical circuit comprising a high power transistor having an emitter electrode, a collector electrode, and a base electrode; a power source for a load circuit connected between the collector and emitter electrodes of said high power transistor; a switching pulse source connected to the base electrode of said high power transistor; and a low power transistor having an emitter electrode, a collector electrode, and a base electrode, said low power transistor having its electrodes connected in parallel with corresponding electrodes of said high power transistor simultaneously, whereby the conduction of both transistors in response to a switching pulse applied simultaneously to their base electrodes combines to form a square wave load pulse.

6. A switching circuit comprising a first transistor having a low frequency response, and a second transistor having a high frequency response, each of said transistors having a base, a collector, and an emitter; a power source connected across the emitter-collector paths of both said transistors; a source of square wave switching pulses connected to the base of both said transistors, whereby said second transistor conducts in response to the high frequency wave components of the switching pulse to provide current for the fast rise time of a square wave load pulse while the first transistor simultaneously conducts in response to the low frequency wave components of the switching pulse to provide the bulk of the current for the square wave load pulse.

7. A switching circuit for providing high current square wave load pulses having steep wave fronts, comprising: a high power transistor and a low power transistor, each of which has an emitter, a collector, and a base; a power source connected by way of a current load across the collectors and emitters of said transistors; a common switching input circuit connected to both said bases; and means provided such that upon switching the transistors into a conducting state in response to a square wave pulse on said switching circuit, the initial current forming the steep wavefront of the square wave load pulse passes through the low power transistor, while the bulk of the current forming the load pulse passes through the high power transistor.

8. A switching circuit comprising means providing a pair of parallel current paths each of which paths includes a n-p-n transistor and each of which transistors differs markedly from the other in maximum frequency-response and power-capacity, one path including a transistor having a high power handling capacity and the other path including a transistor having a low power handling capacity and a power source for a load circuit connected across the current paths, the said means being characterized by respective markedly-differing frequency-response characteristics so that the frequency response of the individual paths are such as to respond to a square-wave input pulse to produce a load current pulse having a steep leading edge and a magnitude equal to the sum of the currents on the parallel paths.

9. The circuit arrangement of claim 8 wherein the stepness of the leading edge of the load current pulse is determined principally by the frequency response of the low power transistor and the magnitude of the current during the pulse period is predominantly determined by the high power transistor.

10. The circuit arrangement of claim 9 wherein the contribution of each path is so arranged as to provide a load current pulse of substantially constant magnitude throughout the pulse period.

References Cited in the file of this patent

UNITED STATES PATENTS

| | | |
|---|---|---|
| 2,014,509 | Roosenstein et al. | Sept. 17, 1935 |
| 2,040,341 | Schmierer | May 12, 1936 |
| 2,680,160 | Yaeger | June 1, 1954 |
| 2,728,857 | Sziklai | Dec. 27, 1955 |
| 2,733,359 | Brown | Jan. 31, 1956 |

OTHER REFERENCES

"Symmetrical Properties of Transistors and Their Applications," by Sziklai, Pro. of the I.R.E., June 1953, pp. 717–724.

Article entitled "Transistors Convert Sine Waves to Pulses," by McMahon, Lebow and Baker, Electronics, May 1954, pages 160–161.